United States Patent
Kastanis et al.

(10) Patent No.: US 6,432,285 B1
(45) Date of Patent: Aug. 13, 2002

(54) PLANAR MAGNETRON SPUTTERING APPARATUS

(75) Inventors: William P. Kastanis, Windsor; M. Elizabeth Wescott, Santa Rosa, both of CA (US)

(73) Assignee: Cierra Photonics, Inc., Santa Rosa, CA (US)

( * ) Notice: Subject to any disclaimer, the term of this patent is extended or adjusted under 35 U.S.C. 154(b) by 0 days.

(21) Appl. No.: 09/687,317

(22) Filed: Oct. 13, 2000

Related U.S. Application Data (60) Provisional application No. 60/159,902, filed on Oct. 15, 1999.

(51) Int. Cl.[7] ............................................. C23C 14/35
(52) U.S. Cl. ........................ 204/298.16; 204/298.17; 204/298.19
(58) Field of Search ................... 204/298.16, 298.17, 204/298.19

(56) References Cited

U.S. PATENT DOCUMENTS

| | | | |
|---|---|---|---|
| 4,401,539 A | 8/1983 | Abe et al. | 204/192 R |
| 5,262,028 A | 11/1993 | Manley | 204/192.12 |
| 5,795,451 A | * 8/1998 | Tan et al. | 204/298.2 |
| 5,961,773 A | * 10/1999 | Ichimura et al. | 156/345 |

FOREIGN PATENT DOCUMENTS

| | | | |
|---|---|---|---|
| JP | 62072121 | 4/1987 | H01L/21/285 |
| JP | 08003740 | 1/1996 | C23C/14/35 |
| JP | 08081769 | 3/1996 | C23C/14/35 |

OTHER PUBLICATIONS

Merriam Webster's Collegiate Dictionary, 10th Edition (1993), p. 941.*

* cited by examiner

*Primary Examiner*—Steven H. Ver Steeg
(74) *Attorney, Agent, or Firm*—Banner & Witcoff, Ltd.

(57) ABSTRACT

A magnet assembly for magnetron sputtering includes a base pole member defining a plane and formed of magnetically permeable material. A center primary magnet is positioned on the base pole member and has its north-south magnetic orientation extending substantially perpendicular to the plane of the base pole member. An outer primary magnet is positioned on the pole member and has a north-south magnetic orientation extending substantially perpendicular to the plane of the base pole member and in a direction opposite to the magnetic orientation of the center primary magnet. A center secondary magnet is positioned between the center primary magnet and the outer primary magnet and has a north-south magnetic orientation extending substantially perpendicular to the plane of the base pole member and in a direction opposite to the magnetic orientation of the center primary magnet.

21 Claims, 6 Drawing Sheets

PLANAR MAGNETRON SPUTTERING APPARATUS

This application claims priority to U.S. Provisional Application No. 60/159,902 filed Oct. 15, 1999.

The present invention relates to a magnetron sputtering apparatus, and, more particularly, to an improved planar magnetron sputtering cathode apparatus.

BACKGROUND

Magnetron sputtering is well known and widely used in production and research applications for the deposition of thin films of various metallic, semiconductor, and ceramic materials on a substrate. A planar target cathode is mounted in a vacuum chamber, and is eroded on one of its surfaces by a DC or RF/AC plasma discharge confined in close proximity to its surface by a closed loop magnetic tunnel. The target, generally a circular or rectangular plate fabricated of the material to be deposited, is electrically connected to the negative side of a DC or biased RF power supply. The positive side of the power supply is connected to a separate anode structure, or may be connected to the vacuum chamber itself if the chamber is electrically conductive. A substrate work piece, the object on which a thin film coating will be deposited, is placed in close proximity to the target cathode. The vacuum chamber is evacuated and a sputtering gas is introduced at low pressure, generally in the range of $10^{-2}$ to $10^{-4}$ Torr, to provide a medium in which a glow discharge plasma can be initiated and maintained. The most common sputtering gas is argon (Ar). In some cases, gases or gas mixtures other than Ar are introduced to the vacuum chamber. For example, in a reactive sputtering process, a deposition compound is synthesized by sputtering a selected target material in the presence of a reactive gas. Deposition of a thin film of $TIO_2$ on a substrate work piece by sputtering metallic Titanium in the presence of an $Ar/O_2$ plasma is one common reactive gas sputtering process. When an electric field of direct voltage is produced by the power supply, the electrons generated move under the influence of the electric field, ionizing the introduced gas molecules and thereby producing within the chamber a plasma of positive gas ions, secondary electrons and ions, desorbed gases and photons. The positive gas ions within the plasma are attracted to and impact the target cathode, causing mainly neutral target atoms and secondary electrons to be ejected from the target surface by kinetic energy transfer. The dislodged neutral target atoms impact and condense on the substrate, forming a thin film of the target material or its reactants.

It was recognized early in the development of thin film sputtering processes that utilizing only an electric field (diode sputtering), while producing uniform thin films, resulted in a low rate of deposition. The total number of ions bombarding the target surface during a given time period was relatively low, yielding a low sputtering rate and, consequently, a low rate of deposition. Therefore, this method was not suitable for rapid thin film deposition or to form relatively thick deposition layers.

To improve the deposition rate, the so called magnetron sputtering method has been introduced, wherein a magnetic field is superimposed on the electric field within the sputtering chamber. The magnetic field is created by a magnet assembly comprising permanent and/or electromagnets, usually placed behind and in close proximity to the back surface of the target cathode. The magnets are generally oriented such that their magnetic axes are parallel or perpendicular to the plane of the target. The conventional magnet assembly of the prior art comprises a central core and outer magnets, in opposite magnetic orientation perpendicular to a magnetically permeable, planar base pole piece supporting and physically connecting both magnets. The magnetic flux, exiting from one pole and returning to the opposite pole, crosses the target twice, forming the convexly arched magnetic field. When properly placed and oriented, the magnets produce a closed loop tunnel within and immediately above the sputtering surface of the target. Secondary electrons, ejected from the negatively charged target surface by impacting positive gas ions, are trapped in the closed loop magnetic field tunnel of the prior art. Primarily through collisions between these trapped secondary electrons and chamber sputtering gas molecules, positive ionization is increased. The plasma discharge density and the ionization efficiency of the discharge current produced by the electric field are thereby enhanced. The enhanced plasma density increases the sputtering rate of the target material, since the total number of ions available near the target for impact with its sputtering surface has increased. A correspondingly high rate of deposition is achieved.

As previously described above, in order to enhance sputtering efficiency, it is desirable to produce and confine the ions and electrons in the glow discharge plasma as close as possible to the surface of the target material. It is also, however, desirable that the plasma density in the discharge be uniform over as much of the target surface as possible in order to erode the largest possible fraction of the target volume. Sputtering targets are generally expensive to produce. Although spent targets may be reworked into new targets, any increase in target utilization results in direct savings of target cost, and indirect savings of reduced chamber downtime for target replacement. A significant limitation of the above described magnetron prior art is that erosion of the planar target takes place in a relatively narrow band within the tunnel width and along the closed loop shape of the magnetic field.

Secondary electrons, ejected from the target under the influence of the electric field normal to the target surface plane, are ejected nearly perpendicularly. As is well known by those of ordinary skill in the art, the component of the convexly arched magnetic field extending parallel to the target surface deflects the electron movement along the path of the magnetic tunnel, causing electrons within the glow discharge to gain a net velocity, with the magnitude and direction of the electron velocity vector being given by the vector cross product of the electric field vector E and the magnetic field vector B (known as the E×B drift velocity). In the region just above both poles of the magnet assembly, the arched magnetic field is almost perpendicular to the target surface, resulting in a very small parallel component. Therefore the electrons can easily escape from the magnetic tunnel. As a result, the ionization region is limited to a narrow band across the arched magnetic tunnel width and along its closed-loop path.

Within the tunnel, the interaction of the drift velocity with the component of the magnetic field perpendicular to the target surface causes another force on the electrons, (V×B), in the direction perpendicular to both the magnetic flux lines and the velocity. These lateral forces "pinch" the electrons in the glow discharge toward the center of the arched tunnel from both sides. This pinching causes the plasma density and, therefore, the sputtering erosion of the target to be highest along the center of the closed-loop path of the magnetic tunnel. As the sputtering erosion proceeds into the target volume, the convexly arched magnetic field, and in particular its perpendicular component, becomes increasingly stronger, causing stronger pinching and typically producing an acute V-shaped erosion groove in the target, centered along the width of the closed-loop path. The fraction of the target volume which has been sputtered by the time the bottom of the erosion groove reaches the back of the target, called the target utilization, is rather low (typically around 10 to 20%) for a conventional magnetron sputtering cathode apparatus.

Various devices in the prior art have been introduced to increase target utilization in magnetron sputtering. For example, electromagnetic sources have been employed to reshape the curvature of the plasma confining magnetic tunnel into a less convex shape, thereby reducing the field component perpendicular to the target surface and increasing the parallel field component responsible for confining the secondary electrons. Electromagnets have also been used by those skilled in the art to apply an oscillating bias to the static field generated by the permanent magnet assembly, thereby varying the point of maximum erosion off center of the confining tunnel and creating an erosion groove less acutely V shaped.

U.S. Pat. No. 4,892,633 to Welty alternatively uses a permanent magnet shunt below the convention magnet assembly to pull down the confining magnetic flux, shaping it into one of slightly concave curvature adjacent the target surface, thereby decreasing the component of the magnetic field perpendicular to the target surface and the resultant (V×B) pinching effect. Apparatus and methods have also been introduced which mechanically rotate, oscillate, or periodically index either the permanent magnet assembly or the target itself to expose different areas of the sputtering surface to the point of maximum erosion. Combinations of the forgoing methods have been introduced and practiced by those skilled in the art to increase target utilization and to provide high, uniform rates of deposition.

Significant disadvantages are associated with all of these approaches, however, with the most obvious being the increased complexity and expenses imposed by the additional electrical and/or structural elements included in these sputtering cathode devices. The introduction of additional elements within the sputtering chamber itself may also necessitate shielding, grounding, or isolating these new elements to avoid contamination of the sputtering process. The techniques described above also generally reduce the average magnetic field strength immediately adjacent and within the target, decreasing the ionization efficiency of the discharge current, increasing the power required to sustain the glow discharge field, and reducing the maximum allowable target thickness or, more accurately, the target width to thickness ratio (aspect ratio). Since the central core magnet mounted on the base pole piece and the outer permanent magnets used to generate the static magnetic field are generally the strongest currently available, e.g., Neodymium Iron Boron (NdFeB) or rare earth magnets, such as Samarium Cobalt (SmCo), or ceramic magnets such as Barium or Strontium Ferrite, the loss of average magnetic field strength cannot be compensated for by the use of stronger permanent magnets.

U.S. Pat. No. 5,262,028 to Manley discloses a magnetron permanent magnet structure that attempts to avoid the magnetic field strength reducing effects and the complex mechanical apparatus of the previous attempts to improve magnetron target utilization. Manley's basic embodiment includes a conventional circular magnet assembly of the prior art including a cylindrical inner central core magnet situated on and concentrically with a circular plate shaped magnetically permeable base pole piece. A plurality of outer magnets are arranged in a ring shaped pattern around the central core magnet. The core magnet and the plurality of outer magnets are magnetically oriented perpendicular to the base pole piece, with their north-south poles extending vertically with respect to the base pole piece, but in opposite magnetic north-south orientation with respect to one another. To this conventional magnet assembly is added a plurality of primary inner magnets arranged in a ring shaped pattern mounted to or slightly spaced from the central core magnet. Each primary inner magnet has its north-south magnetic orientation parallel to the base pole piece, that is, in a horizontal orientation with respect to the base pole piece, and perpendicular to the vertical magnetic orientations of the central magnet and the outer magnets. The Manley assembly produces a magnetic field having magnetic flux lines that form four separate closed-loop plasma-confining magnetic tunnels or lobes (upper, lower, inner and outer). The lower, inner, and outer magnetic lobes confine the secondary electrons in the glow discharge adjacent the target erosion surface, serving the function of the prior art single closed-loop magnetic tunnel. However, the device of Manley is not stable, since the primary inner magnets, which are magnetically aligned horizontally with respect to the base pole piece, tend to flip toward a vertical orientation. Thus, the primary inner magnets must be secured in place, e.g., by gluing, increasing manufacturing costs and complexity. The horizontal orientation of the primary inner magnets also reduces the space available for the cooling water that is necessary in the magnetron assembly to produce higher power and improved production rates. Additionally, in the device of Manley, gaps, or grooves, must be formed in the base pole piece in order to properly form the four magnetic lobes and avoid magnetic shunting through the base pole piece. Forming the base pole piece with the required gaps also increases manufacturing complexity and costs.

SUMMARY

Preferred embodiments of the present invention provide a structure that generates a magnetic field having magnetic flux lines which form three separate closed-loop plasma-confining magnetic tunnels or lobes (upper, inner and outer), all located substantially within the sputtering region over a sputtering target surface. The present invention can improve utilization of the sputtered target, and can also deposit the sputtering material, or its reactants, more uniformly on a substrate work piece. Preferred embodiments of the present invention also can utilize thicker target materials with reduced width to thickness aspect ratios. Planar magnetron sputtering apparatus in accordance with certain preferred embodiments have an improved magnetic field shape to reduce the plasma pinching effect associated with prior art magnetrons, while maintaining mechanical and electrical simplicity of the magnet assembly and target. Other objects and advantages of this invention will be apparent from a reading of the following specification and claims taken with the drawings.

Planar magnetron sputtering magnet assemblies according to the present invention include a sputtering magnet assembly positioned adjacent the back surface of a horizontal planar target for generating a magnetic field with magnetic flux lines that define a three lobed sputtering region adjacent the front surface of the target and within the target body. The magnetic flux lines form a disperse, closed-loop, plasma confining field substantially uniform throughout the sputtering region. The magnetic flux lines from three separate magnetic lobes that project into the target region, forming a closed loop tunnel effective in confining the glow discharge within the sputtering region. There is a wide area in the center of the tunnel with little or no perpendicular magnetic field component which could create lateral forces on moving electrons. Therefore, the trapped secondary electrons and positively charged sputtering gas ions circulating in the plasma are confined in a closed loop volume spread out over a wide area, adjacent the erosion surface. The magnetic lobes continue to effectively confine the plasma over a wide area within the sputtering region as the target material is sputtered away.

In accordance with one aspect, a magnetron sputtering assembly includes a pole member that defines a plane and is formed of magnetically permeable material. A center primary magnet is positioned on the pole member and oriented such that a north-south magnetic orientation of the center primary magnet extends substantially perpendicular to the plane of the pole member. An outer primary magnet is positioned on the pole member proximate an outer edge of the pole member, with a north-south magnetic orientation of the outer primary magnet extending substantially perpendicular to the plane of the pole member and opposite to the north-south orientation of the center primary magnet. A center secondary magnet is positioned on the pole member between the center primary magnet and the outer primary magnet, with a north-south magnetic orientation of the center secondary magnet extending substantially perpendicular to the plane of the pole member and opposite to the north-south orientation of the center primary magnet.

In accordance with another aspect, a magnetron sputtering assembly includes a pole member that defines a plane and is formed of magnetically permeable material. A center primary magnet is concentrically positioned on the pole member and oriented such that a north-south magnetic orientation of the center primary magnet extends substantially perpendicular to the plane of the pole member. A plurality of outer primary magnets are positioned on the pole member proximate an outer edge of the pole member, with a north-south magnetic orientation of each outer primary magnet extending substantially perpendicular to the plane of the pole member and opposite to the north-south orientation of the center primary magnet. A plurality of center secondary magnets are positioned on the pole member between the center primary magnet and the outer primary magnets, with a north-south magnetic orientation of each center secondary magnet extending substantially perpendicular to the plane of the pole member and opposite to the north-south orientation of the center primary magnet.

In accordance with yet another aspect, a magnetron sputtering assembly for sputtering a rectangular target includes an elongated pole member formed of magnetically permeable material that defines a plane. An elongated center magnet assembly is positioned on the pole member and includes a pair of first center primary magnets and a plurality of second center primary magnets oriented in linear fashion between the first center primary magnets, with each center primary having a north-south magnetic orientation extending substantially perpendicular to the plane of the pole member. A plurality of outer primary magnets are positioned on the pole member, with each outer primary magnet being substantially equidistant from the center magnet assembly. A north-south magnetic orientation of each outer primary magnet extends substantially perpendicular to the plane of the pole member and opposite to the north-south orientation of the center primary magnets. A plurality of center secondary magnets are positioned on the pole member between the center primary magnet assembly and the outer primary magnets, with a north-south magnetic orientation of each center secondary magnet extending substantially perpendicular to the plane of the pole member and opposite to the north-south orientation of the center primary magnets.

Additional objects, advantages, and novel features of the invention shall be set forth in part in the description that follows, and in part will become apparent to those skilled in the art upon examination of the following, or may be learned by the practice of the invention. The objects and the advantages of the invention may be realized and attained by means of the instrumentalities and in combinations particularly pointed out in the appended claims.

BRIEF DESCRIPTION OF THE DRAWINGS

Preferred embodiments are described in detail below with reference to the appended drawings.

The figures referred to above are not drawn necessarily to scale and should be understood to present a representation of the invention, illustrative of the principles involved. Some features of the magnet assembly depicted in the drawings have been enlarged or distorted relative to others to facilitate explanation and understanding. The same reference numbers are used in the drawings for similar or identical components and features shown in various alternative embodiments. Magnet assemblies for magnetron sputtering as disclosed herein, will have configurations and components determined, in part, by the intended application and environment in which they are used.

DETAILED DESCRIPTION OF PREFERRED EMBODIMENTS

The magnet assembly present invention for magnetron sputtering is capable of many configurations, each of which is based upon the shape of the target and the erosion pattern that is desired. In certain preferred embodiments, the target is a generally planar plate, having a circular or rectangular shape. In the case of a circular target, a round or circular magnet assembly is used that generates magnetic tunnels for confining plasma having the shape of circular rings. In the case of a rectangular target, the magnetic tunnels include a pair of linear, parallel spaced apart sections, joined to one another at each end by a semi-circular portion, forming a substantially oval or "racetrack" shape. In the embodiments described below, the magnetron assembly is described in connection with circular and rectangular targets. It is to be appreciated that the present invention could be used with targets of other shapes as well.

For simplicity, the following description and drawings are limited to the magnet assembly itself. The other components of the magnetron sputtering assembly, e.g., vacuum chamber, cooling and mounting mechanisms, and electrical and grounding components, are well known to those of skill in the art, and are not shown or described here.

In the following description, certain elements are described as having horizontal or vertical orientations, as well as being above, or below, other elements. It is to be appreciated that these relative terms are used herein merely to help describe the illustrated preferred embodiments, and that other spatial orientations of these elements are considered within the scope of the invention.

Figure 1:
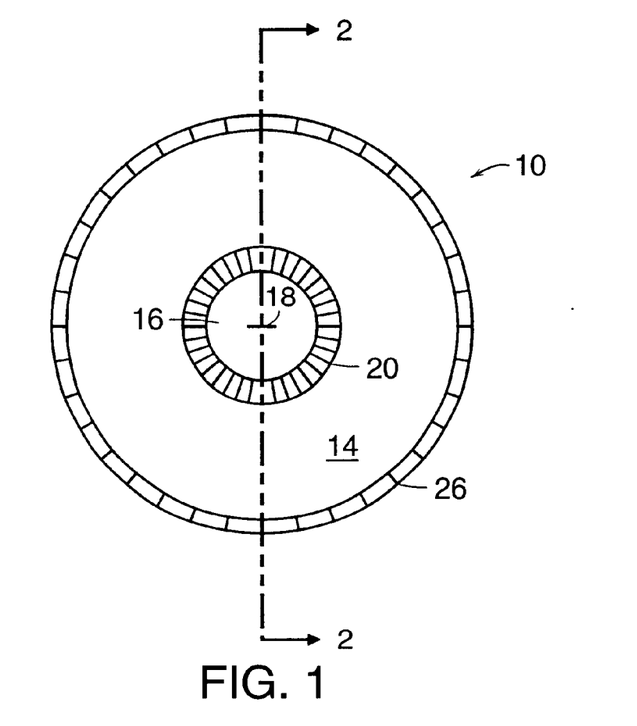
FIG. 1 is a plan view of a magnet assembly of the present invention.
Figure 2:
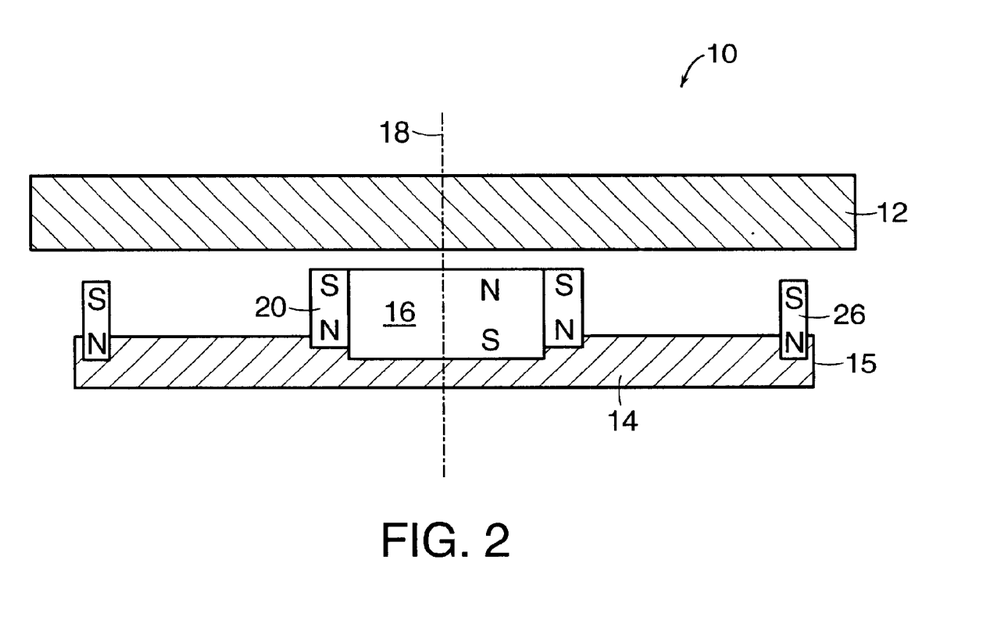
FIG. 2 is a section view, taken along line 2—2 of FIG. 1, of the magnet assembly of FIG. 1, shown with a target.

FIGS. 1 and 2 show a magnet assembly 10 in accordance with the present invention. In combination these figures show the relative positions of a circular target 12 and the elements of a circular embodiment of magnet assembly 10 of the present invention. Magnet assembly 10 includes a horizontal circular plate-shaped base pole piece 14, defining a plane and having an axis of symmetry 18. Base pole piece 14 is preferably made from a magnetically permeable material such as such as iron, magnetic stainless steel, or nickel. A target 12 is positioned above magnet assembly 10.

A vertical, cylindrically shaped center primary magnet 16 is positioned on, and substantially at the center of, base pole piece 14, concentric with axis of symmetry 18. Center primary magnet 16 is oriented so that its north-south magnetic orientation is substantially perpendicular to the plane of base pole piece 14. A plurality of vertical center secondary magnets 20 are positioned on base pole piece 14, around center primary magnet 16, preferably forming a ring about center primary magnet 16. In the illustrated embodiment, center secondary magnets 20 are in contact with center primary magnet 16. Each center secondary magnet 20 has its north-south magnetic orientation aligned substantially perpendicular to the plane of base pole piece 14, but opposite the magnetic orientation of center primary magnet 16. In certain preferred embodiments, a single circular center secondary magnet may be used in place of the plurality of center secondary magnets 20.

A plurality of vertical outer primary magnets 26 are positioned on base pole piece 14 around center primary magnet 16, near the outer edge 15 of pole piece 14. Each outer primary magnet 26 has its north-south magnetic orientation aligned substantially perpendicular to the plane of base pole piece 14, and opposite to the magnetic orientation of center primary magnet 16. Outer primary magnets 26 also preferably form a ring about center primary magnet 16. In certain preferred embodiments, a single circular outer primary magnet may be used in place of the plurality of outer primary magnets 26.

Figure 3:
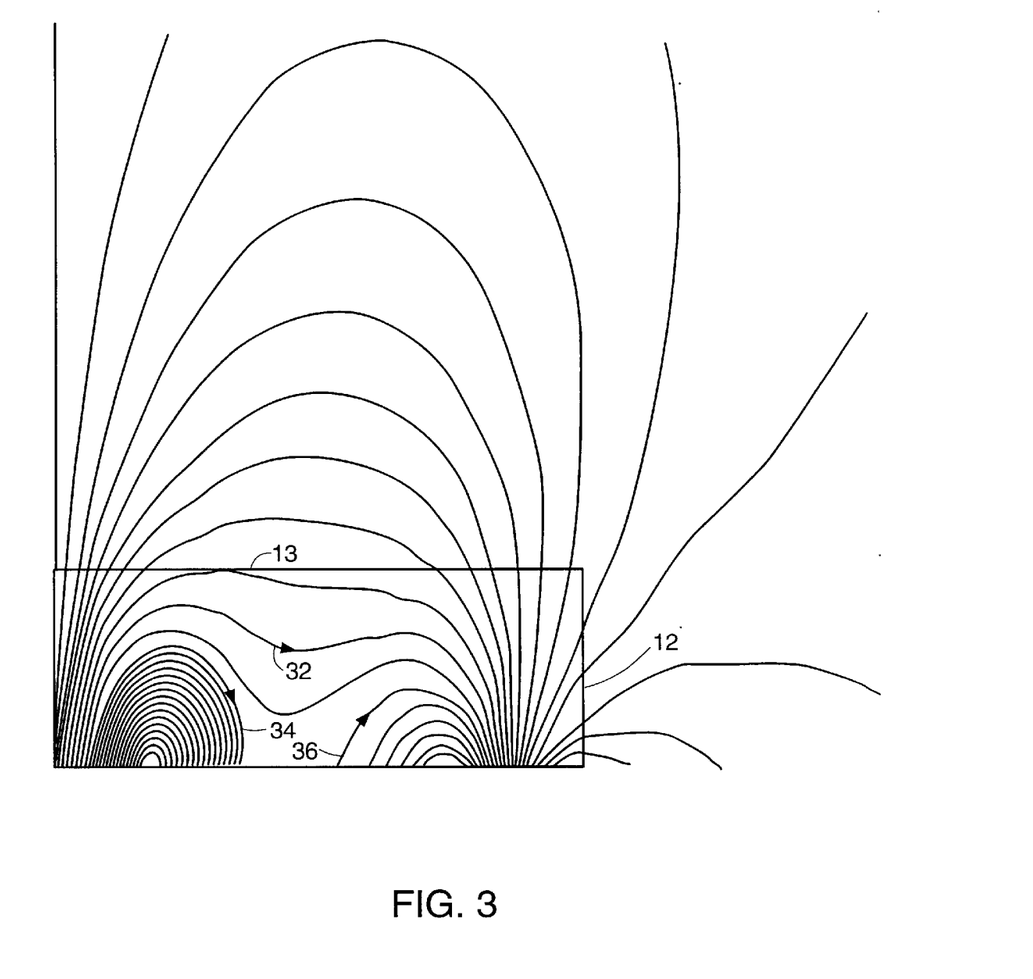
FIG. 3 is a section view, shown partially broken away, of the magnet assembly of FIG. 1, showing the magnetic flux lines created by the magnet assembly.

In use, a low pressure sputtering atmosphere is established in a sputtering chamber and a glow discharge is created over a sputtering region on the target located within the sputtering chamber. A magnetic field is then generated that has a plurality of magnetic flux lines adjacent the front surface of the target and within the target body. FIG. 3 shows the flux lines of a three lobed magnetic field generated within the target sputtering region by the preferred embodiment of the magnetic assembly 10 shown in FIGS. 1 and 2. As is known, the spacing between each of the flux lines is proportional to the magnetic flux density or field strength. As the magnetic field increases in strength, the flux lines get closer together. Upper magnetic lobe 32, inner magnetic lobe 34, and outer magnetic lobe 36 act as separate closed-loop tunnels confining the glow discharge plasma within the sputtering region as the target erodes, while avoiding the severe "pinching" effect of the prior art. A large, significantly homogeneous magnetic field horizontal component, parallel to the base pole piece 14, is generated within the sputtering region by the magnetic assembly 10.

Figure 4:
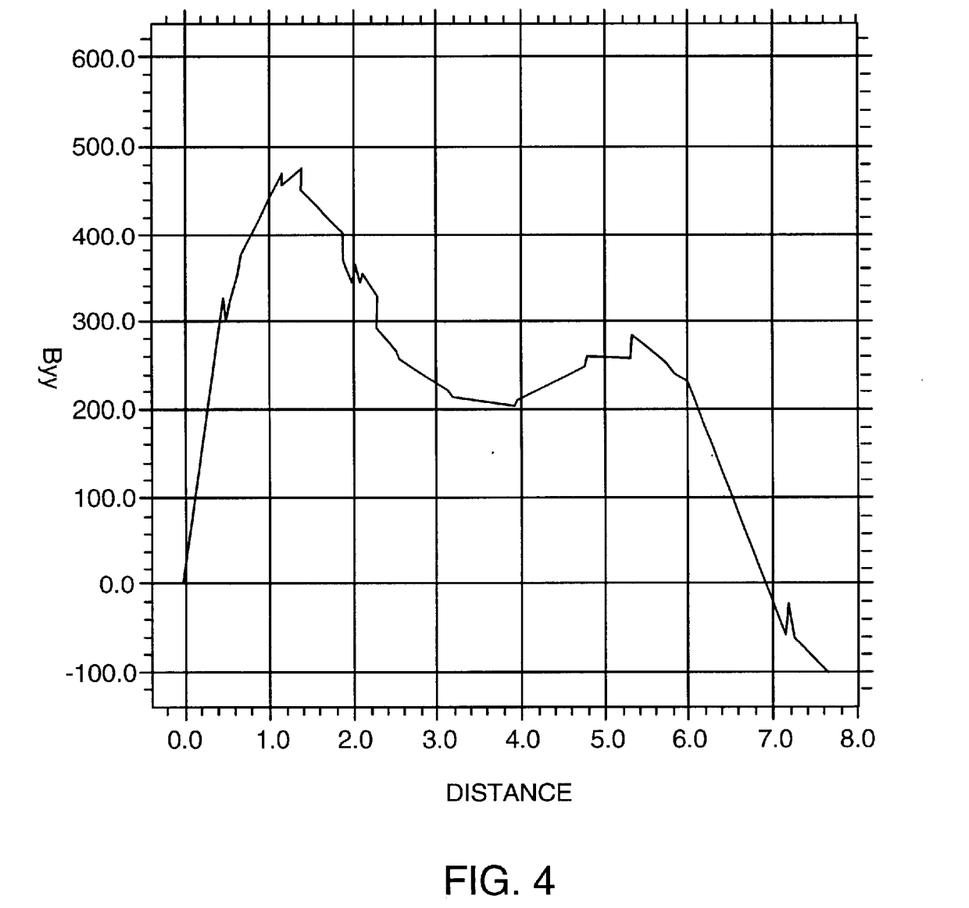
FIG. 4 is a graph showing the horizontal magnetic field strength along the magnet assembly of FIG. 1.

FIG. 4 shows a graph of the typical horizontal magnetic field component strength at the target sputtering surface across the width of the target. FIG. 4 displays the horizontal magnetic field strength in gauss (Byy) as measured outwardly from centerline 18 of a 6 inch wide magnetic assembly 10 (Distance). The minimum horizontal field strength necessary to sustain a stable magnetic flex is generally a minimum of 150 to 180 gauss. FIG. 4 indicates that the horizontal magnetic field component exceeded this value over a significant percentage of the target width.

Figure 5:
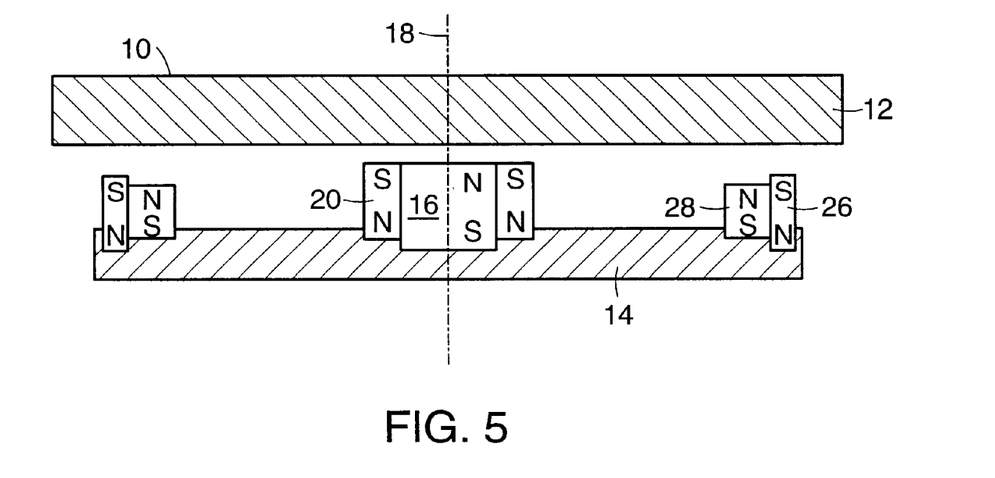
FIG. 5 is a section view of a second embodiment of the magnet assembly of the present invention.

Another preferred embodiment is shown in FIG. 5, and includes a plurality of vertical outer secondary magnets 28 positioned on base pole piece 14 between center secondary magnets 20 and outer primary magnets 26. Each outer secondary magnet 28 has its north-south magnetic orientation aligned substantially perpendicular to the plane of base pole piece 14, and in the same direction as the magnetic orientation of center primary magnet 16. In the illustrated embodiment, outer secondary magnets 28 are in contact with outer primary magnets 26. Outer secondary magnets 28 also preferably form a ring about center primary magnet 16. In certain preferred embodiments, a single circular outer secondary magnet may be used in place of the plurality of outer secondary magnets 28.

The vertical orientation of center primary magnet 16, outer primary magnets 26, center secondary magnets 20, and outer secondary magnets 28 with respect to horizontally oriented pole member 14 in the illustrated embodiment allows for tighter alignment of the magnets, resulting in a larger flow area for the cooling water channel (not shown) that is used to provide cooling to magnet assembly 10. By providing a larger flow area, more cooling can be introduced, resulting in higher power for the sputtering apparatus, and, consequently, higher production rates.

Exemplary magnets for use in magnet assembly 10 include, but are not limited to, Neodymium Iron Boron (NdFeB), rare earth magnets, such as Samarium Cobalt (SmCo), and ceramic magnets such as Barium or Strontium Ferrite.

Figure 6:
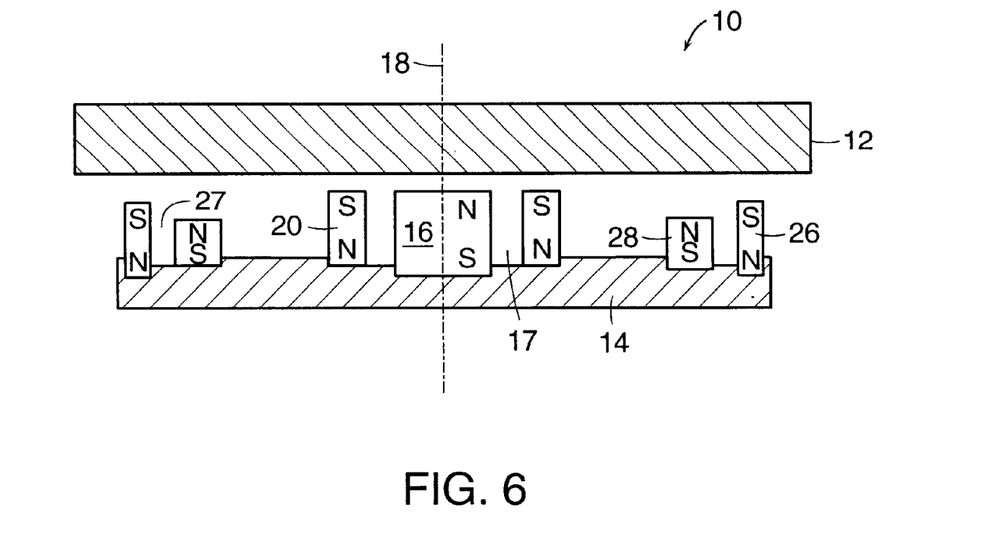
FIG. 6 is a section view of a third embodiment of the magnet assembly of the present invention.
Figure 7:
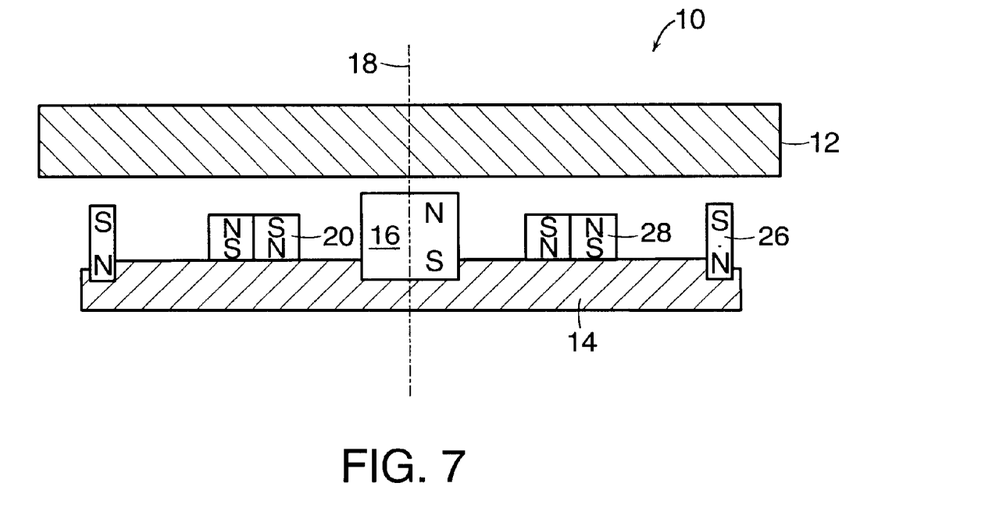
FIG. 7 is a section view of a fourth embodiment of the magnet assembly of the present invention.

Turning now to FIG. 6, another preferred embodiment is shown, wherein center secondary magnets 20 are slightly spaced from center primary magnet 16 by a gap 17. Outer secondary magnets 28 are similarly spaced from outer primary magnets 26 by a gap 27. Yet another preferred embodiment is shown in FIG. 7. In this embodiment, center secondary magnets 20 are spaced from center primary magnet 16 and outer secondary magnets 28 are spaced from outer primary magnets 26 such that center secondary magnets 20 and outer secondary magnets 28 are in contact with one another.

Figure 8:
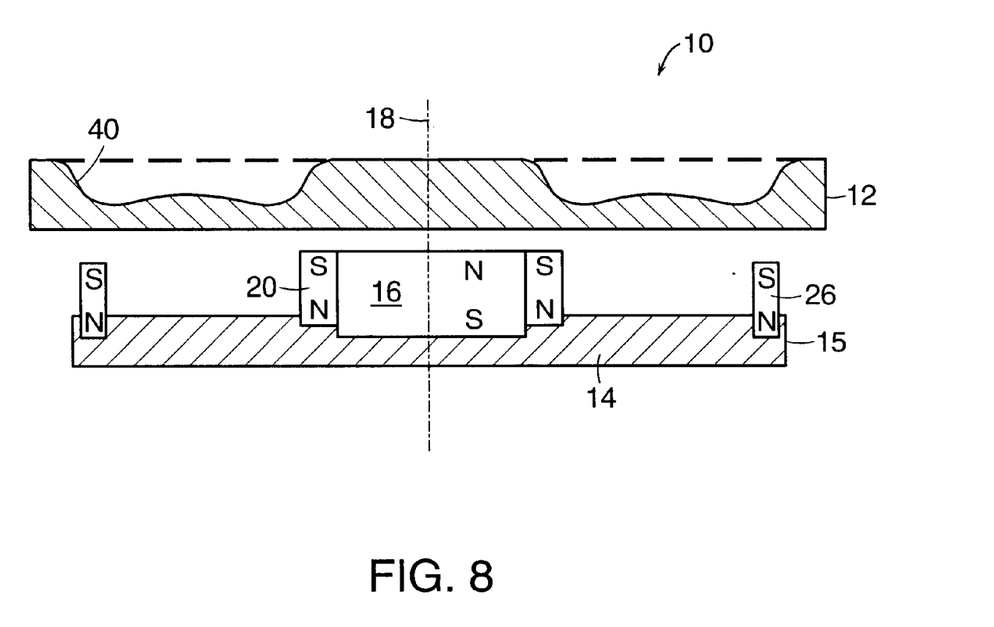
FIG. 8 is a section view showing the resultant erosion groove in a target using the embodiment shown in FIG. 2.

The configuration, arrangement and orientation of the magnets of magnetic assembly 10, particularly the perpendicular magnetic orientation of all the magnets with respect to the plane of the base pole piece, are significant novel features of the present invention. The three lobe magnetic field within the sputtering region formed by magnetic assembly 10 is an additional significant feature of the present invention. This unique three lobed field is capable of establishing and maintaining a stable, uniform homogeneous glow discharge throughout the utilization of the target during sputtering, providing a more evenly dispersed erosion groove. As can be seen in FIG. 8, an erosion groove 40 utilizing the embodiment described above with respect to FIG. 2 is much wider and flatter than the erosion grooves of many prior art devices.

The improved planar magnetron sputtering magnet assembly according to the present invention may be variously embodied, depending on target material, thickness and shape, the pattern of erosion sought in a particular sputtering operation, and other magnetron sputtering apparatus conditions well known to those skilled in the art. Planar magnetron sputtering assemblies in accordance with the present invention provide target utilization on the order of about 45%–60%, depending on their particular configuration.

The present invention does not rely on base pole piece gaps or grooves, necessary in the Manley device to avoid magnetic shunting through the base pole piece. The arrangement of all of the magnets in the present invention obviates the need for such base pole gaps. Additionally, no outer and inner ring shaped pole pieces are necessary to modify the magnetic flux configuration into a more effective shape, as are required in some prior art devices.

As noted above, rectangular embodiments of the present invention, suited to the sputtering of rectangular targets, are also possible. In such a rectangular embodiment, the closed loop path of the three lobed, plasma confining magnetic field is a flattened oval "racetrack" consisting of two parallel linear sections joined at each end to a plurality of adjacent chord segments in a semicircular section.

Figure 9:
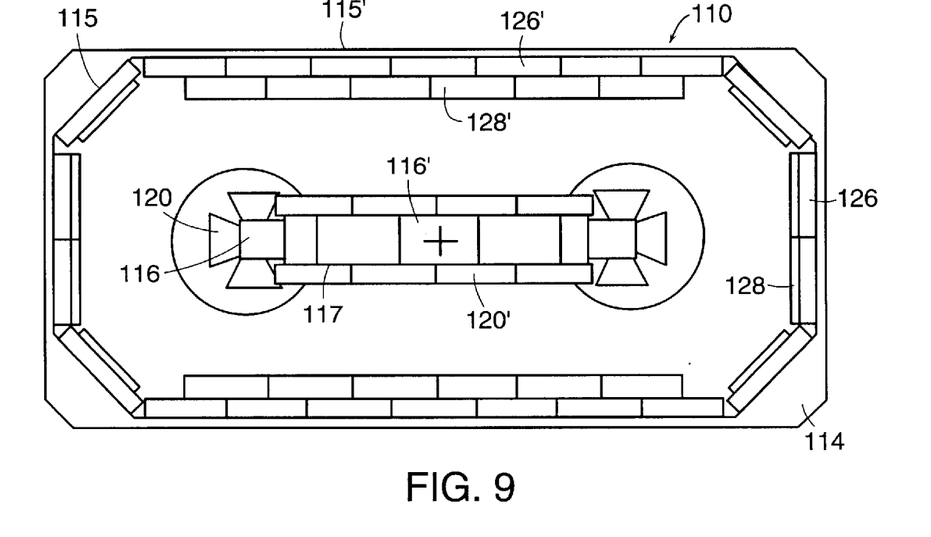
FIG. 9 is a plan view of another preferred embodiment of the magnet assembly of the present invention, having a rectangular shaped configuration.

FIG. 9 shows a plan view of a rectangular embodiment of the present invention. A sputtering magnet assembly 110 for use with rectangular targets comprises a substantially rectangular shaped base pole piece 114 for supporting semicircular and linear magnet structures. In the illustrated embodiment, a portion of the corners of pole piece 114 are cut off. It is to be appreciated that each end of pole piece 114 may have a semi-circular shape, providing an oval or racetrack shaped pole piece.

A pair of semi-circular end sections 115 include a center primary magnet 116 surrounded by a plurality of center secondary magnets 120. A plurality of outer primary magnets 126 are disposed about the periphery of base pole piece 114. A plurality of outer secondary magnets 128 are disposed between center secondary magnets 120 and outer primary magnets 126. The configuration of elongated rectangular center section 115' separating the two semicircular end sections 115 is analogous to the configuration of each semicircular end section, with the only difference being that the magnets in the center section are arranged linearly. Thus, rectangular center section 115' includes a plurality of linear center primary magnets 116'. Center primary magnets 116' extend in linear fashion between center primary magnets 116 forming a center primary magnet assembly 117. A plurality of linear center secondary magnets 120' are disposed on either side of center primary magnets 116'. A plurality of outer primary magnets 126' are disposed on opposite sides of center section 115' proximate the outer edges of center section 115', with a plurality of outer secondary magnets 128' disposed on each side of center section 115' between center secondary magnets 120' and outer primary magnets 126.

Essentially, then, elongated center section 115' "stretches out" the magnetic field between the two semi-circular end sections 115 to form a closed three lobed magnetic racetrack having substantially identical cross-sections at all points along the racetrack. As with the corresponding circular embodiments, outer secondary magnets 128 and linear outer secondary magnets 128' may be absent in particular preferred embodiments. Center gaps and outer gaps may also be created between respective primary and secondary magnets as described above with respect to the circular embodiments. Additional rectangular embodiments of the present invention are possible and will become readily apparent to those skilled in the art, given the benefit of this disclosure.

The desired magnetic field shape for a given set of target and sputtering conditions may be obtained through a variety of embodiments of the present invention. Multiple solutions are available which achieve the desired uniform, parallel flux field configuration while maintaining the minimum field strength necessary to support the glow discharge plasma in a stable state. Magnet size, strength, aspect (width to depth) ratio, spacing and other design variables are investigated with the aid of finite element analysis programs to achieve a desired field for a given set of sputtering conditions.

In light of the foregoing disclosure of the invention and description of the preferred embodiments, those skilled in this area of technology will readily understand that various modifications and adaptations can be made without departing from the scope and spirit of the invention. All such modifications and adaptations are intended to be covered by the following claims.

What is claimed is:

1. A magnetron sputtering assembly comprising, in combination:
   a pole member defining a plane and being formed of magnetically permeable material;
   a center primary magnet positioned on the pole member and oriented such that a north-south magnetic orientation of the center primary magnet extends substantially perpendicular to the plane of the pole member;
   an outer primary magnet positioned on the pole member proximate an outer edge of the pole member, a north-south magnetic orientation of the outer primary magnet extending substantially perpendicular to the plane of the pole member and opposite to the north-south orientation of the center primary magnet;
   a center secondary magnet positioned on the pole member between the center primary magnet and the outer primary magnet, a north-south magnetic orientation of the center secondary magnet extending substantially perpendicular to the plane of the pole member and opposite to the north-south orientation of the center primary magnet,
   wherein the center secondary magnet is in contact with the center primary magnet.

2. The magnetron sputtering assembly of claim 1, wherein the center primary magnet, outer primary magnet, and center secondary magnet together generate a magnetic field having magnetic flux lines that form an upper magnetic lobe, an inner magnetic lobe, and an outer magnetic lobe, each lobe defining a closed-loop plasma discharge confining field.

3. The magnetron sputtering assembly of claim 1, wherein the center primary magnet is positioned substantially at a center of the pole member.

4. The magnetron sputtering assembly of claim 1, further comprising an outer secondary magnet positioned between the center secondary magnet and the outer primary magnet, a north-south magnetic orientation of the outer secondary magnet extending substantially perpendicular to the plane of the pole member and in the same direction as the north-south orientation of the center primary magnet.

5. The magnetron sputtering assembly of claim 4, wherein the outer secondary magnet is in contact with the outer primary magnet.

6. The magnetron sputtering assembly of claim 1, wherein the pole member comprises a substantially circular plate.

7. The magnetron sputtering assembly of claim 1, further comprising a plurality of additional outer primary magnets, each outer primary magnet positioned on the pole member about the center primary magnet and proximate an outer edge of the pole member, a north-south magnetic orientation of each outer primary magnet extending substantially perpendicular to the plane of the pole member and opposite to the north-south orientation of the center primary magnet.

8. The magnetron sputtering assembly of claim 7, wherein the outer primary magnets form a circle.

9. The magnetron sputtering assembly of claim 7, further comprising a plurality of additional center secondary magnets, each center secondary magnet positioned on the pole member between the center primary magnet and the outer primary magnets, a north-south magnetic orientation of each center secondary magnet extending substantially perpendicular to the plane of the pole member and opposite to the north-south orientation of the center primary magnet.

10. The magnetron sputtering assembly of claim 9, wherein the center secondary magnets form a circle.

11. The magnetron sputtering assembly of claim 9, wherein the center secondary magnets are in contact with the center primary magnet.

12. The magnetron sputtering assembly of claim 9, further comprising a plurality of outer secondary magnets, each outer secondary magnet positioned on the pole member between the center secondary magnets and the outer primary magnets, a north-south magnetic orientation of each outer secondary magnet extending substantially perpendicular to the plane of the pole member and in the same direction as the north-south orientation of the center primary magnet.

13. The magnetron sputtering assembly of claim 12, wherein the outer secondary magnets are in contact with the outer primary magnets.

14. The magnetron sputtering assembly of claim 12, wherein the center secondary magnets are in contact with the center primary magnet.

15. A magnetron sputtering assembly comprising, in combination:
  a pole member defining a plane and being formed of magnetically permeable material;
  a center primary magnet concentrically positioned on the pole member and oriented such that a north-south magnetic orientation of the center primary magnet extends substantially perpendicular to the plane of the pole member;
  a plurality of outer primary magnets positioned on the pole member proximate an outer edge of the pole member, a north-south magnetic orientation of each outer primary magnet extending substantially perpendicular to the plane of the pole member and opposite to the north-south orientation of the center primary magnet;
  a plurality of center secondary magnets positioned on the pole member between the center primary magnet and the outer primary magnets, a north-south magnetic orientation of each center secondary magnet extending substantially perpendicular to the plane of the pole member and opposite to the north-south orientation of the center primary magnet,
  wherein the center secondary magnets are in contact with the center primary magnet.

16. The magnetron sputtering assembly of claim 15, further comprising a plurality of outer secondary magnets positioned on the pole member between the center secondary magnets and the outer primary magnets, a north-south orientation of each outer secondary magnet extending substantially perpendicular to the plane of the pole member and in the same direction as the north-south orientation of the center primary magnet.

17. A magnetron sputtering assembly for sputtering a rectangular target comprising, in combination:
  an elongated pole member formed of magnetically permeable material defining a plane;
  an elongated center magnet assembly positioned on the pole member and comprising a pair of first center primary magnets and a plurality of second center primary magnets oriented in linear fashion between the first center primary magnets, each center primary having a north-south magnetic orientation extending substantially perpendicular to the plane of the pole member;
  a plurality of outer primary magnets positioned on the pole member, each outer primary magnet being substantially equidistant from the center magnet assembly, and wherein a north-south magnetic orientation of each outer primary magnet extends substantially perpendicular to the plane of the pole member and opposite to the north-south orientation of the center primary magnets;
  a plurality of center secondary magnets positioned on the pole member between the center primary magnet assembly and the outer primary magnets, a north-south magnetic orientation of each center secondary magnet extending substantially perpendicular to the plane of the pole member and opposite to the north-south orientation of the center primary magnets.

18. The magnetron sputtering assembly of claim 17, further comprising a plurality of outer secondary magnets positioned on the pole member between the center secondary magnets and the outer primary magnets, a north-south orientation of each outer secondary magnet extending substantially perpendicular to the plane of the pole member and in the same direction as the north-south orientation of the center primary magnet.

19. The magnetron sputtering assembly of claim 18, wherein the center secondary magnets are in contact with the center magnet assembly.

20. The magnetron sputtering assembly of claim 18, wherein the outer secondary magnets are in contact with the outer primary magnets.

21. The magnetron sputtering assembly of claim 18, wherein the center secondary magnets are in contact with the outer secondary magnets.

* * * * *